(12) United States Patent
Kuenemund

(10) Patent No.: US 11,410,987 B2
(45) Date of Patent: Aug. 9, 2022

(54) CHIP AND METHOD FOR MANUFACTURING A CHIP

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/176,196

(22) Filed: Feb. 16, 2021

(65) Prior Publication Data

US 2021/0257363 A1  Aug. 19, 2021

(30) Foreign Application Priority Data

Feb. 18, 2020  (DE) .................... 10 2020 104 141.1

(51) Int. Cl.
*H01L 27/02* (2006.01)
*H01L 21/8238* (2006.01)
(Continued)

(52) U.S. Cl.
CPC .. *H01L 27/0207* (2013.01); *H01L 21/823814* (2013.01); *H01L 21/823828* (2013.01);
(Continued)

(58) Field of Classification Search
CPC ............. H01L 27/0207; H01L 27/092; H01L 21/823871; H01L 21/823814; H01L 21/823828; H01L 29/0847; H01L 29/41775; H01L 29/401; H01L 2027/11874; H01L 2027/11861
See application file for complete search history.

(56) References Cited

U.S. PATENT DOCUMENTS 5,532,509 A *  7/1996  D'Addeo .......... H01L 27/11898
                                                257/E27.11
9,318,607 B2 *  4/2016  Seo .................... H01L 27/1211
(Continued)

FOREIGN PATENT DOCUMENTS

DE  102014212359 A1  1/2015

OTHER PUBLICATIONS

German Office Action issued for corresponding DE application 10 2020 104 141.1 dated Dec. 19, 2020, 5 pages (for informational purposes only).

*Primary Examiner* — Michael M Trinh
(74) *Attorney, Agent, or Firm* — Viering, Jentschura & Partner mbB

(57) ABSTRACT

A chip is described including a semiconductor layer including doped regions; a metallization layer on the semiconductor layer and at least one cell row including p-channel field effect transistors and n-channel field effect transistors, wherein the doped regions form source regions and drain regions of the p-channel field effect transistors and the n-channel field effect transistors; contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates.

13 Claims, 13 Drawing Sheets

(51) Int. Cl.
*H01L 27/092* (2006.01)
*H01L 29/08* (2006.01)
*H01L 29/417* (2006.01)
*H01L 29/40* (2006.01)
*H01L 27/118* (2006.01)

(52) U.S. Cl.
CPC .... *H01L 21/823871* (2013.01); *H01L 27/092* (2013.01); *H01L 29/0847* (2013.01); *H01L 29/401* (2013.01); *H01L 29/41775* (2013.01); *H01L 2027/11861* (2013.01); *H01L 2027/11875* (2013.01)

(56) References Cited

U.S. PATENT DOCUMENTS

| | | | |
|---|---|---|---|
| 10,580,774 B2* | 3/2020 | Rasouli | H03K 17/168 |
| 2015/0014775 A1 | 1/2015 | Seo et al. | |
| 2015/0241902 A1 | 8/2015 | Chang et al. | |
| 2016/0163644 A1* | 6/2016 | Woo | H01L 21/76897 |
| | | | 438/586 |
| 2019/0074297 A1* | 3/2019 | Kish | H01L 27/0924 |
| 2020/0098764 A1* | 3/2020 | Wang | H01L 29/42356 |
| 2021/0272916 A1* | 9/2021 | Kuenemund | H03K 19/00315 |

* cited by examiner

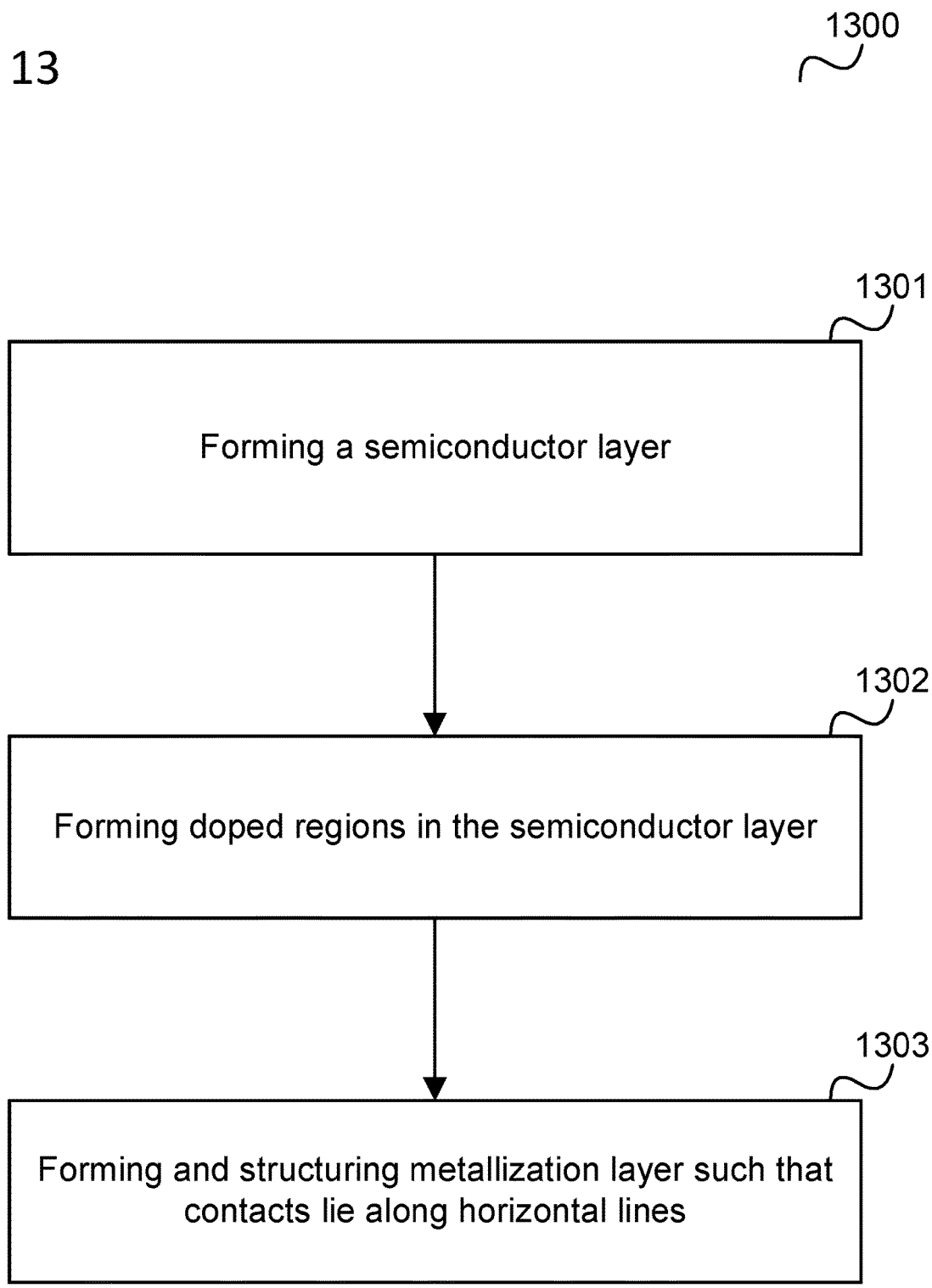

US 11,410,987 B2

CHIP AND METHOD FOR MANUFACTURING A CHIP

CROSS-REFERENCE TO RELATED APPLICATION

This application claims priority to German Patent Application Serial No. 10 2020 104 141.1, which was filed Feb. 18, 2020, and is incorporated herein by reference in its entirety.

TECHNICAL FIELD

The present disclosure relates to a chip and a method for manufacturing a chip.

BACKGROUND

Integrated circuits in form of computer chips are very widely used in many devices. For reasons such as a desired extension or change of functionality the situation may arise that a chip should be replaced by another chip which functions differently. Since complete chip re-designs require much effort and time, it is desirable, if the required changes are not too extensive, to use a so-called IC derivative instead, i.e. a modified chip that is derived from the current chip (rather than a complete re-design).

Therefore, circuit and module design concepts are desirable in order to enable rapid, reliable and cost-efficient succession of IC derivatives.

SUMMARY

According to various embodiments, a chip is provided including a semiconductor layer including doped regions; a metallization layer on the semiconductor layer and at least one cell row including pchannel field effect transistors and nchannel field effect transistors, wherein the doped regions form source regions and drain regions of the p-channel field effect transistors and the nchannel field effect transistors; contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates; wherein the contacts connecting the source regions and the drain regions of all p-channel field effect transistors in the at least one cell row to the metallization layer lie along a first line of the metallization grid, the contacts connecting the source regions and the drain regions of all n-channel field effect transistors in the at least one cell row to the metallization layer lie along a second line of the metallization grid and the contacts connecting the gate regions of all p-channel field effect transistors and of the plurality of n-channel field effect transistors in the at least one cell row to the metallization layer lie along a third line of the metallization grid.

According to a further embodiment, a method for manufacturing a chip according to the above-described chip is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 13 shows a flow diagram 1300 illustrating a method for manufacturing a chip.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
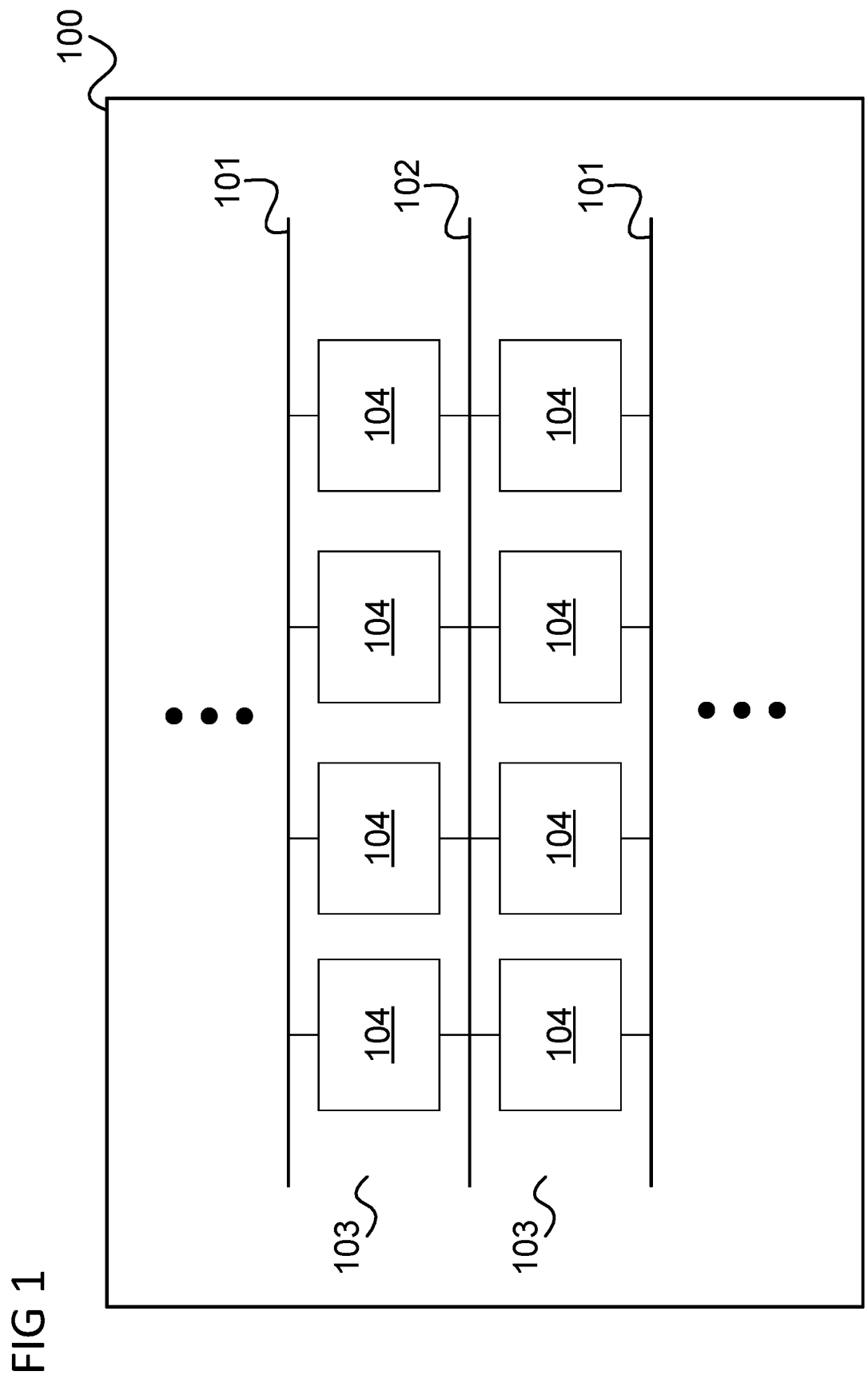
FIG. 1 shows a top view of an integrated circuit.

FIG. 1 shows a top view of an integrated circuit 100.

The chip 100 includes a plurality of supply lines 101, 102 delimiting a plurality of cell rows 103. The supply lines 101, 102 include supply lines 101 for a high supply potential (VDD) and supply lines 102 for a low supply potential (VSS).

In each cell row 103, a multiplicity of logic cells, each forming a logic gate 104, are formed. Each logic gate 104 implements a Boolean function and is supplied by the supply lines 101, 102 bordering the cell row by one or more supply metal lines per supply line 101, 102.

The logic gates 104 are formed by field effect transistors (FETs), in this example by p-channel field effect transistors and n-channel field effect transistors in CMOS (Complementary Metal Oxide Semiconductor) technology.

Figure 2:
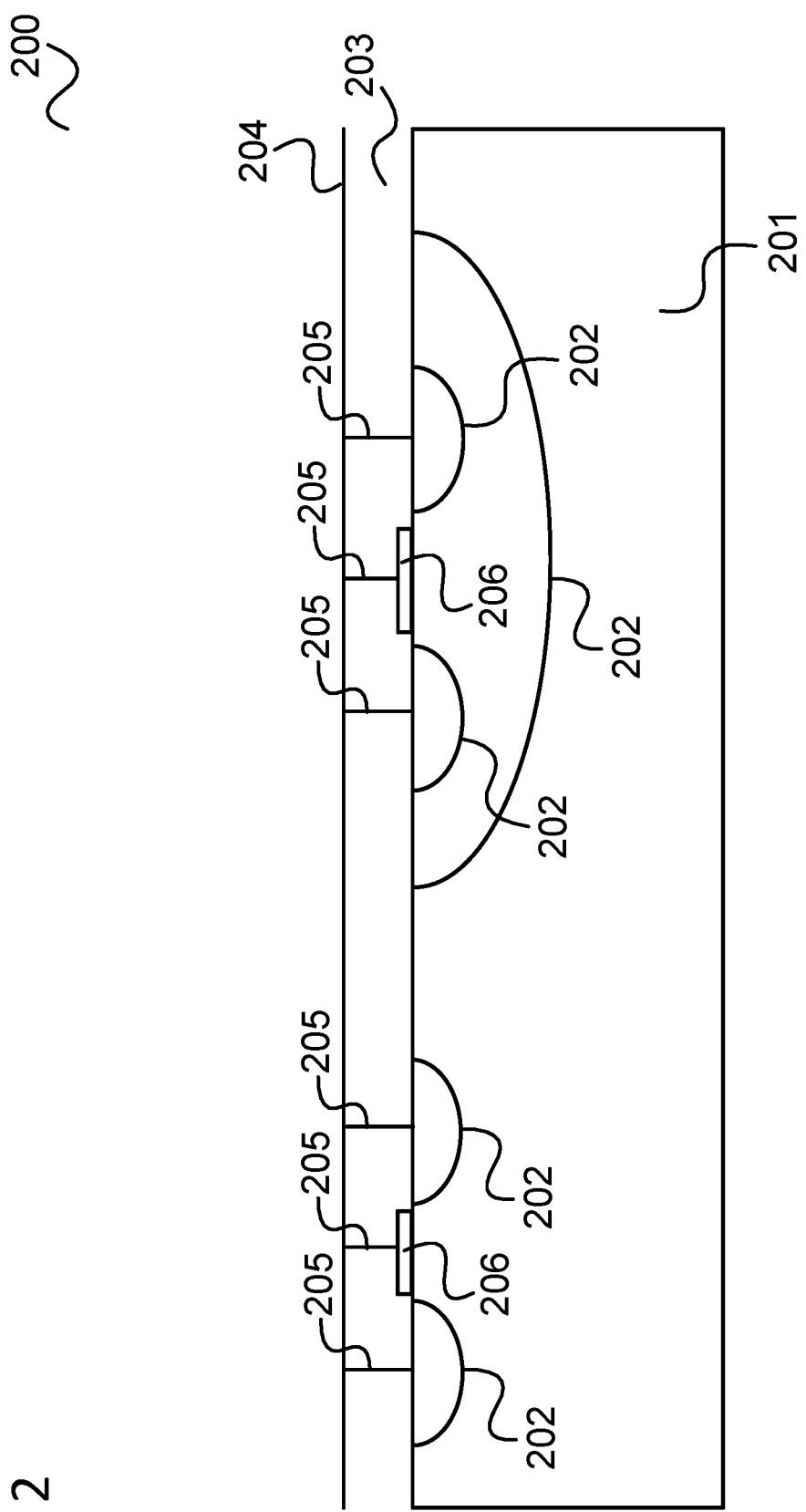
FIG. 2 shows a side view of an integrated circuit whose top view is shown in FIG. 1.

FIG. 2 shows a side view of an integrated circuit 200 whose top view is shown in FIG. 1.

The integrated circuit 200 includes a semiconductor layer 201 in the form of (or formed by a part of) a semiconductor substrate in which doped regions 202 are formed such as, depending on the doping of the substrate, p regions directly in the substrate, n regions directly in the substrate, n wells (with p regions therein) and p wells (with n regions therein) or also triple wells.

(Transistor) gate electrodes 206 may be formed between doped regions, e.g. by gate metal or polycrystalline silicone (poly-Si) such that field effect transistors (e.g. MOSFETs (Metal Oxide Semiconductor Field Effect Transistors)) are formed.

Above the semiconductor layer 201 there is a metallization layer 204 (typically denoted as metal 1 or M1 as being the lowest metallization layer above the substrate and gate layers). The metallization layer 204 is insulated from the semiconductor layer 201 and from the gates by an insulating layer 203 (i.e. a dielectric layer e.g. formed by an oxide or a nitride) but may be connected to the doped regions 202 as well as gate electrodes 206 by means of contacts 205.

The metallization layer 204 is structured (and possibly connected to upper (e.g. metal) layers) such that the doped regions 202 and gate electrodes 206 are connected in such a way to form, by means of the field effect transistors, the logic gates 104. It should be noted that the metallization layer 204 may be structured such that some of the contacts 205 are not connected to any other contacts 205 via any metal line of the lowest or any of the upper metallization layers. This means that while all contacts 205 extend through the insulating layer (e.g. in the form of metal plugs or contacts to the metallization layer 204, only a (true) subset of the contacts 205 connects to other elements of the set of contacts 205, neither by direct connections via the first metal layer 204 nor by any of the upper metal layers.

It should be noted that herein "contacts" is used to refer to connections extending from the semiconductor layer to the metallization layer, i.e., when seen from the side, vertical connections of the chip. Metal lines of the metallization layer also form connections which are horizontal connections of the chip when seen from the side.

The structuring of the metallization layer 204 defines the connections within cells 104 (i.e. between terminals of field effect transistors), between cells 104 as well as connections to terminals of the chip (e.g. input and output pins).

The metallization layer 204 in particular forms the supply lines 101, 102.

According to various embodiments, concepts are provided to enable rapid successions of cost-efficient IC derivatives. More specifically, according to various embodiments, for enabling metal-only module derivatives are provided, i.e. concepts that allow forming derivatives by modifying only the metallization layer 204 while keeping the semiconductor layer 201 and all CMOC devices unchanged. In particular, according to various embodiments, a circuit design concept and flow are provided to allow for cell-based and metal-reprogrammable sequential and combinational logic.

According to an embodiment, the concepts to enable rapid succession of IC derivatives are based on flexible cell libraries and design flow enhancements to enable semi-automated module derivation on RTL (Register Transfer Level).

For example, flexible circuitry is provided based on a physical design concept for rendering CMOS representations of different Boolean functions interchangeable. This means that a modified integrated circuit may be provided as follows:

Point of origin: layout of standard or non-standard cell with a Boolean "FUNCTION A".

Modify only the pin- and/or cell-internal and/or inter-cell metal (or contact) connectivity (e.g. by changing the structuring of the metal layer 204) to transform FUNCTION A into an appropriate different Boolean FUNCTION B.

Do the routing of multiple instances of FUNCTIONs to provide metal and/or contact-only derivatives that behave different due to different Boolean and physical characteristics In particular, according to one embodiment the following physical design rules are used:

Placement of all M1-diffusion and M1-gate contacts at same positions along the vertical axis, i.e. at same distances relative to VSS and VDD (where M1 indicates the lowest metal level, conventionally used for intra-cell wiring of Standard Cells of Semi-Custom cell libraries).

Figure 3:
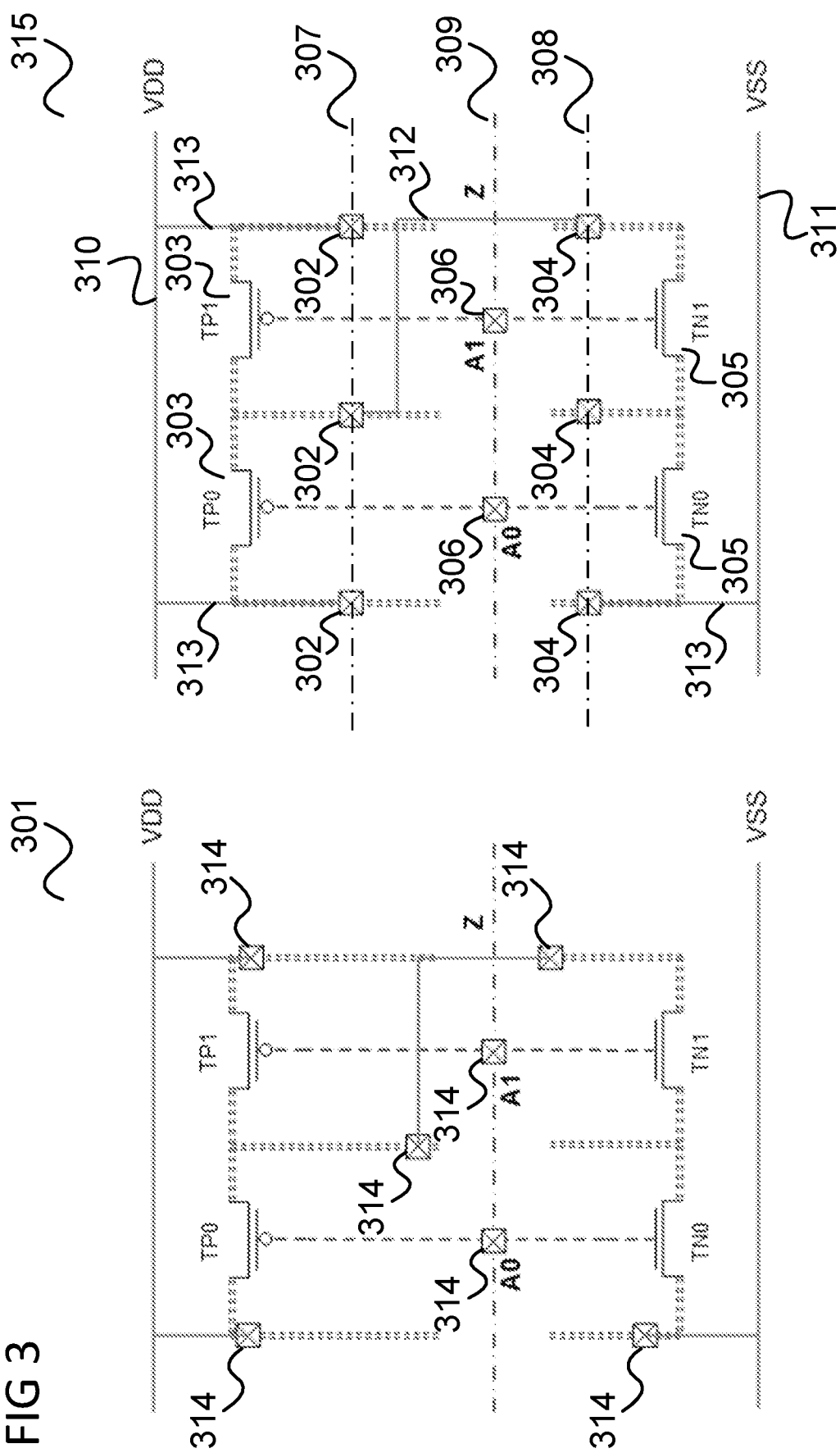
FIG. 3 illustrates an example for a design rule applied to a NAND gate.

M1-diffusion contacts on all diffusion areas between MOSFETs, even if a given contact is not needed for the particular Boolean function;

FIG. 3 illustrates an example for an application of these design rules to a NAND gate, e.g. corresponding to one of the logic cells 104.

In FIG. 3 and the following figures of logic gates top views are shown in which metal connections (formed by metallization layer 204) are indicated by solid lines, doped regions (corresponding to doped regions 202) are indicated by double dashed lines, contacts corresponding to contacts 205 are indicated by boxes containing an 'x' and (transistor) gates (forming gate electrodes 206) are indicated by dashed lines.

In FIG. 3, two versions 301, 315 of a NAND gate are shown. The first version (shown on the left) has a design as it may be conventionally used: contacts 314 are placed at positions to keep the necessary metal lines (e.g. to connect source or drain regions to supply lines) as short as possible.

In contrast, the second version 315 (shown on the right) is formed according to the physical design rules used according to various embodiments:

The contacts 302 belonging to source or drain regions of p-channel field effect transistors 303 are arranged along a first horizontal line 307 (when the chip is seen from the top), the contacts 304 belonging to source or drain regions of n-channel field effect transistors 305 are arranged along a second horizontal line 308 and the contacts 306 of transistor gates are arranged along a third horizontal line 309.

The contacts of other logic cells (even all or at least substantially all) logic gates in the same cell row may be arranged similarly along the horizontal lines 307, 308, 309 (i.e. p-channel FET contacts along the first horizontal line 307, n-channel FET contacts along the second horizontal line 308 and gate contacts along the third horizontal line 309).

The horizontal lines 307, 308, 309 are arranged in accordance with the metallization grid of the chip which defines where metal lines formed by the metallization layer 204 may be positioned according to the possible structuring of the metallization layer 204. These possible positions of metal lines are also referred to as metal tracks, i.e. tracks of the metallization layer 204.

In particular, the horizontal lines 307, 308, 309 are parallel to the supply lines 310, 311 defining the cell row in which the logic gate 315 is located (i.e. to which it belongs).

The horizontal lines 307, 308, 309 may be chosen such that a metal track fits between each horizontal line and the neighboring horizontal line or supply line. This means in the example of FIG. 3 that the metallization grid includes a metal track between the high potential supply line 310 and the first horizontal line 307, a metal track between the first horizontal line 307 and the third horizontal line 309, a metal track between the third horizontal line 309 and the second horizontal line 308 and a metal track between the second horizontal line 309 and the low potential supply line 311.

In fact, the metal track between the first horizontal line 307 and the third horizontal line 309 is used for a metal line 312 between FETs in the example of FIG. 3.

Figure 4:
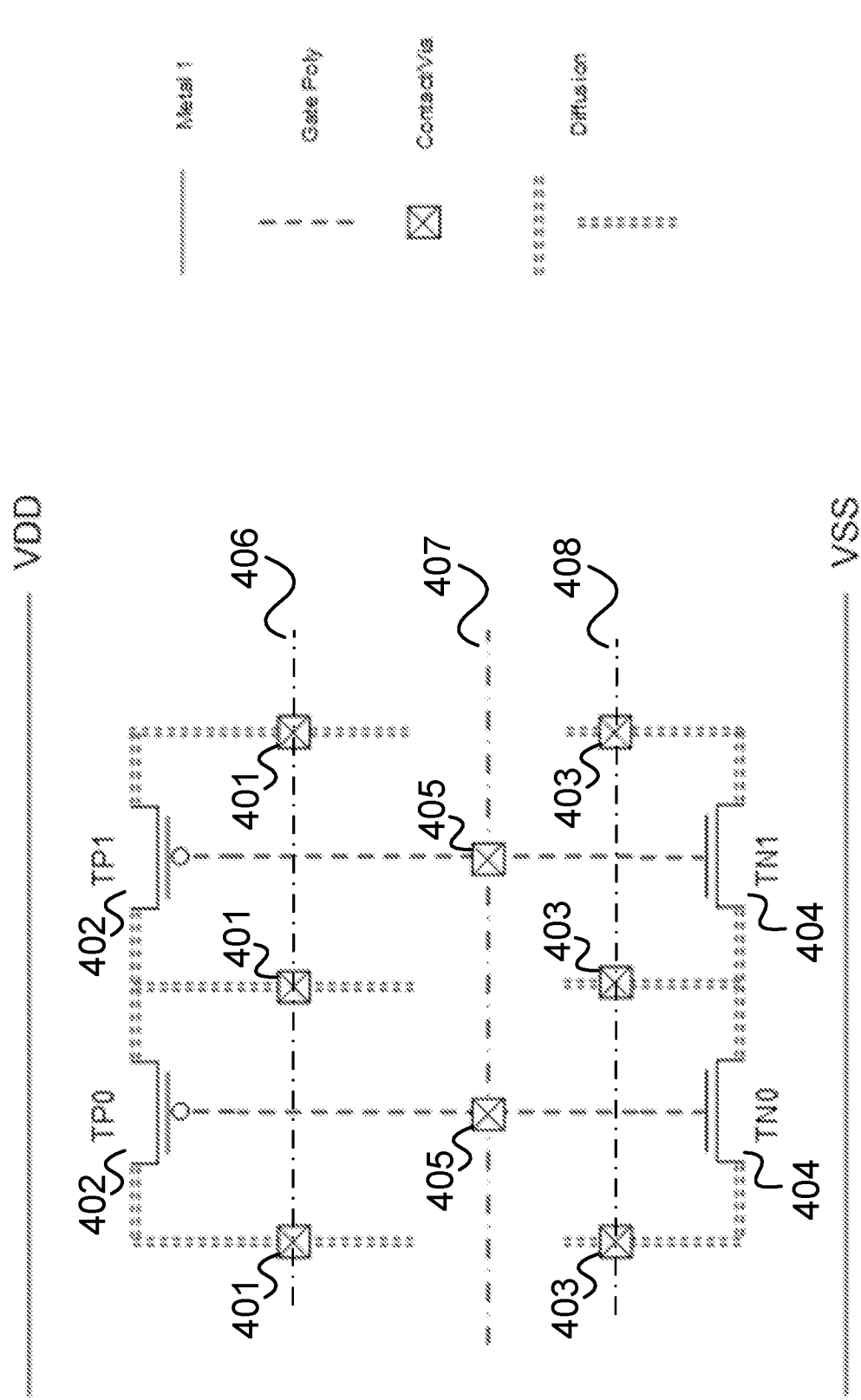
FIG. 4 shows a logic gate base design according to an embodiment.

FIG. 4 shows a logic gate base design 400 which may be seen as a physical design template for logic gates with a width of three poly-pitches such as the one of FIG. 3.

As in the example of FIG. 3, the contacts 401 belonging to source or drain regions of p-channel field effect transistors 402 are arranged along a first horizontal line 406, the contacts 403 belonging to source or drain regions of n-channel field effect transistors 404 are arranged along a second horizontal line 407 and the contacts 405 of transistor gates (i.e. gate poly-Si regions) are arranged along a third horizontal line 408.

Based on the logic gate base design 400, various logic gates may be built by forming respective metal lines by the metal layer 204, i.e. by corresponding structuring of the metal layer 204. Thus, based on a chip with a design including doped regions 202 and contacts 205 of the logic gate base design as shown in FIG. 4, a multiplicity of chips of different functionalities may be easily derived by selecting a suitable patterning (structuring) of the chip's metal layer 204.

It should be noted that the logic gate base design 400 includes contacts 401, 403, 405 for every source and drain region and every gate electrode of the field effect transistors 402, 404 such that any Boolean function (which may be realized with two p-channel FETs and two n-channel FETs in this case) can be implemented by a suitable structuring of the metal layer 204. For example, when considering the source regions, drain regions and gate regions of all field effect transistors of the cell row 103 (or possibly over all cell rows), at least the majority (e.g. more than 80%, more than 90% or more than 95%) of those source regions, drain regions and gate regions have contacts 205 extending to the first metallization layer 204. Some of those contacts 205 may be "floating", i.e. may, due to the structuring of the metallization layer 204, not be connected to any of the other contacts 205 via any metal line of the metallization layer 204 and/or via any of the upper metal layers.

An example for a logic gate which may be built based on the logic gate base design 400 includes the logic gate 315 of FIG. 3 for which the metal layer 204 is structured to form the metal line 312 and metal lines 313 between supply lines 310, 311 and source/drain contacts, whereas the gate contacts 306 receive and connect to the NAND gate's inputs A0 and A1.

Further examples are given in the following.

Figure 5:
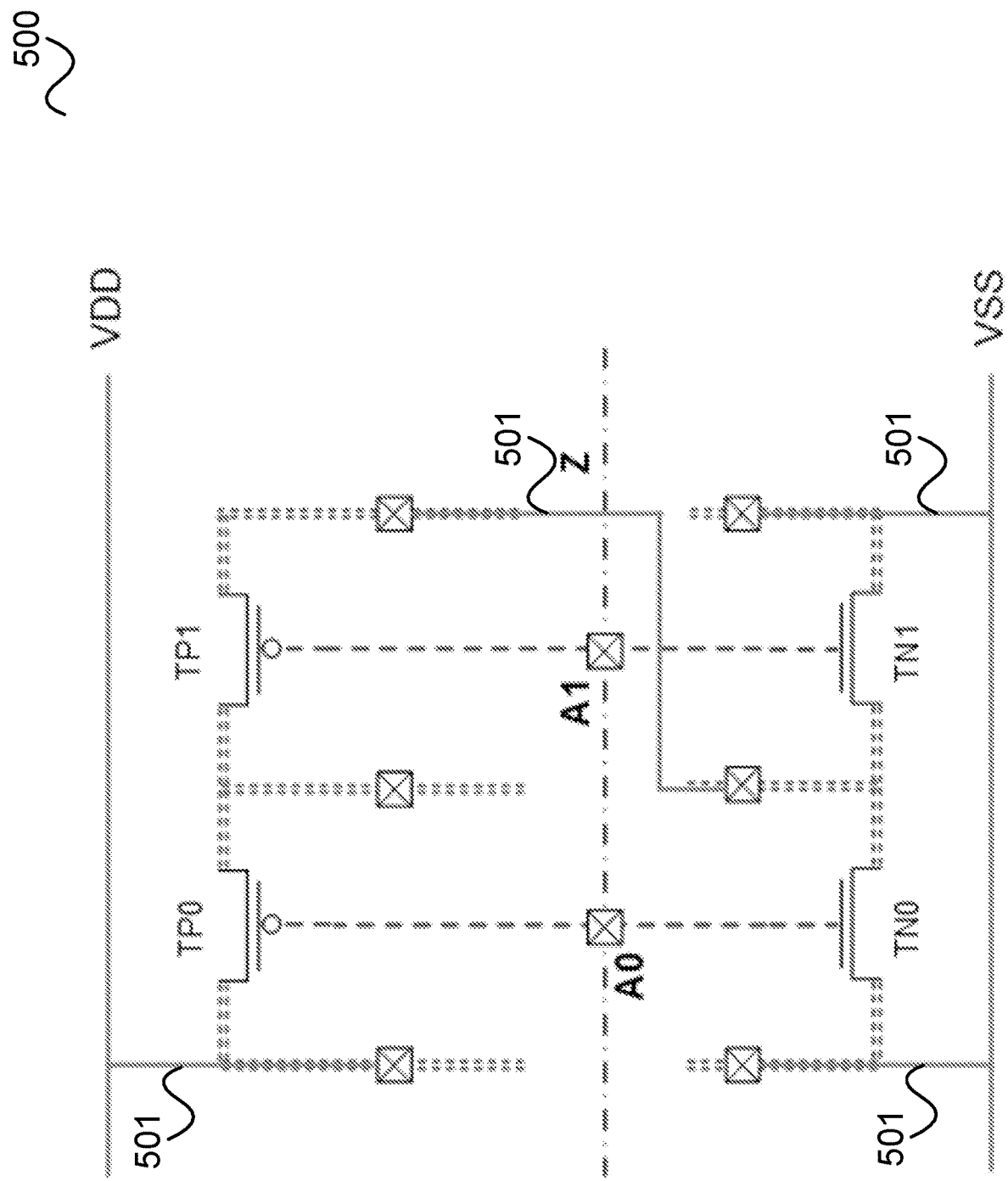
FIG. 5 shows a NOR logic gate formed on the basis of the logic gate base design of FIG. 4.

FIG. 5 shows a NOR logic gate 500 for which the metal layer 204 is structured to form metal lines 501.

The following examples of FIGS. 6 to 9 show four different incarnations of 3 poly pitches wide so-called TIE cells, each providing the supply potential levels VDD at node T1 and VSS at node T0.

Figure 6:
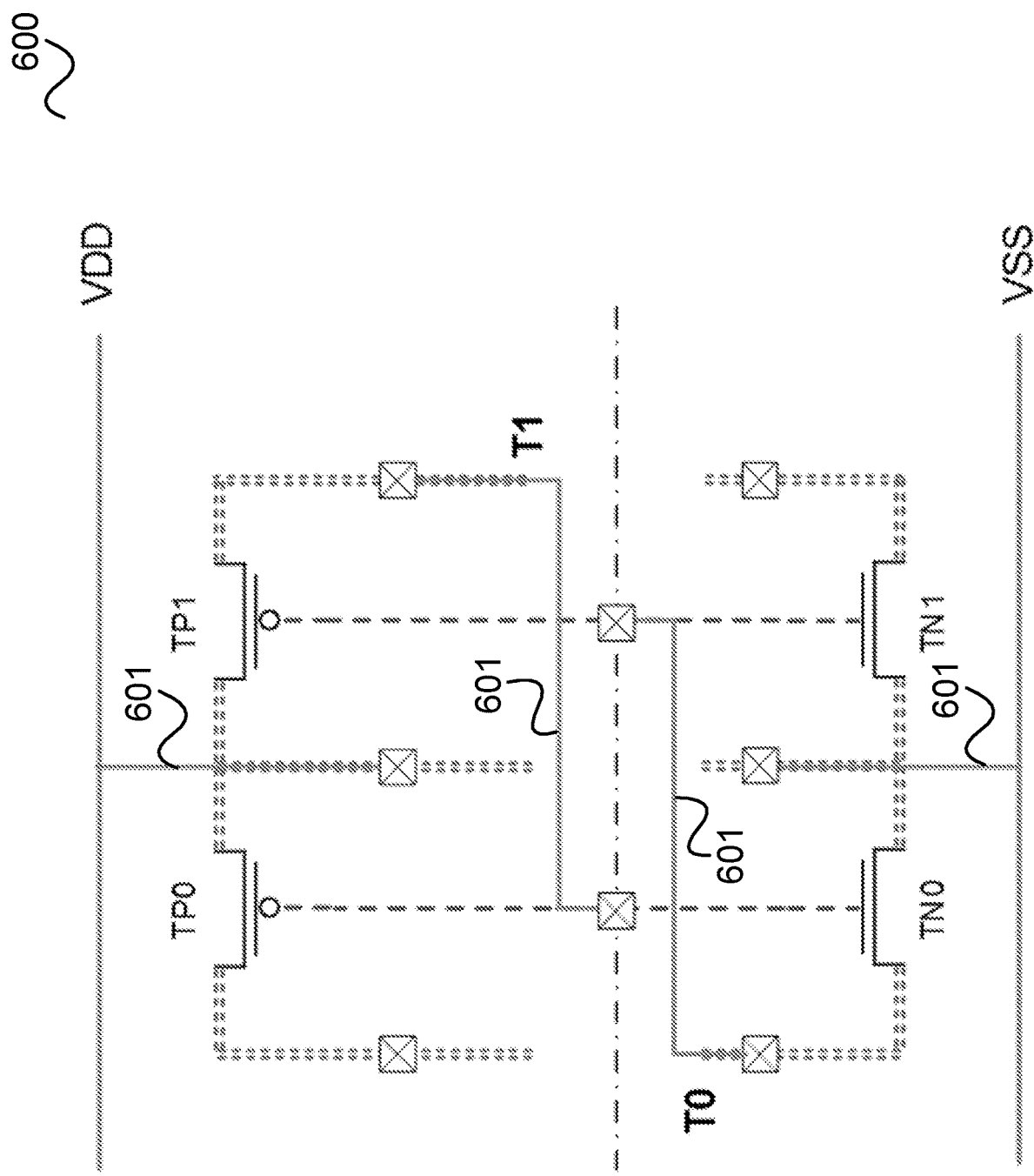
FIG. 6 shows a first TIE cell variant formed on the basis of the logic gate base design of FIG. 4.

FIG. 6 shows a first TIE cell variant 600 for which the metal layer 204 is structured to form metal lines 601.

Figure 7:
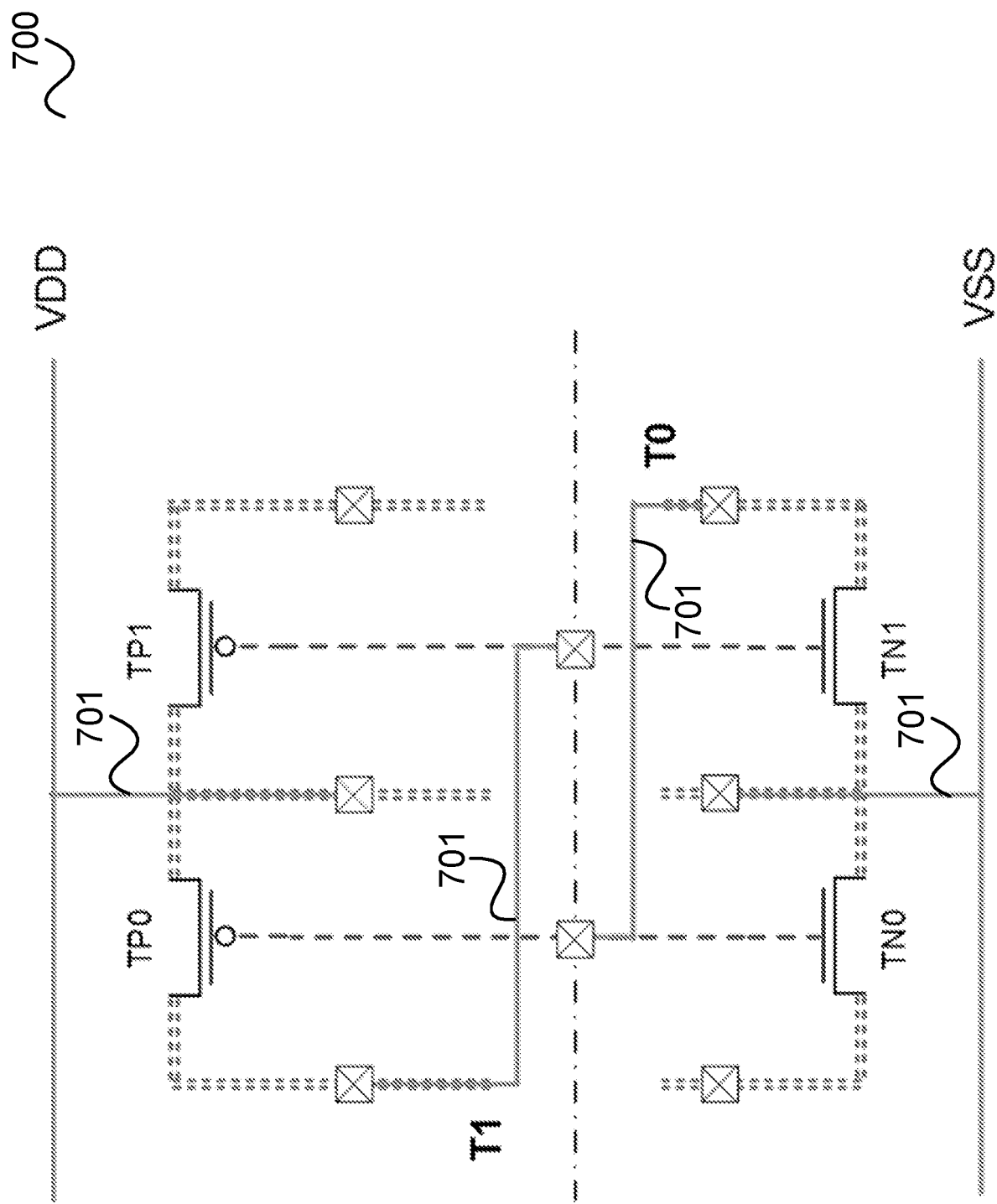
FIG. 7 shows a second TIE cell variant formed on the basis of the logic gate base design of FIG. 4.

FIG. 7 shows a second TIE cell variant 700 for which the metal layer 204 is structured to form metal lines 701.

Figure 8:
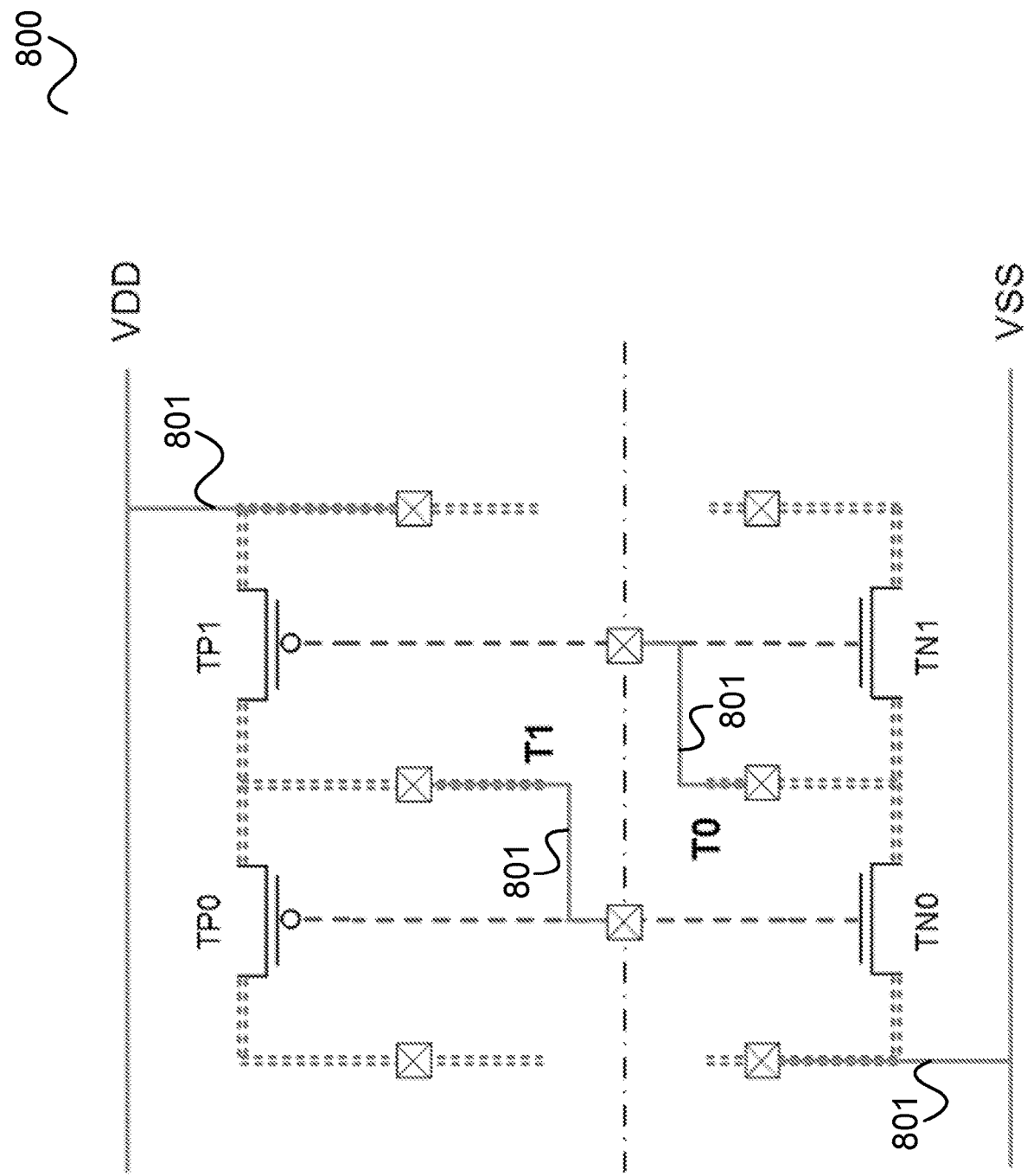
FIG. 8 shows a third TIE cell variant formed on the basis of the logic gate base design of FIG. 4.

FIG. 8 shows a third TIE cell variant 800 for which the metal layer 204 is structured to form metal lines 801.

Figure 9:
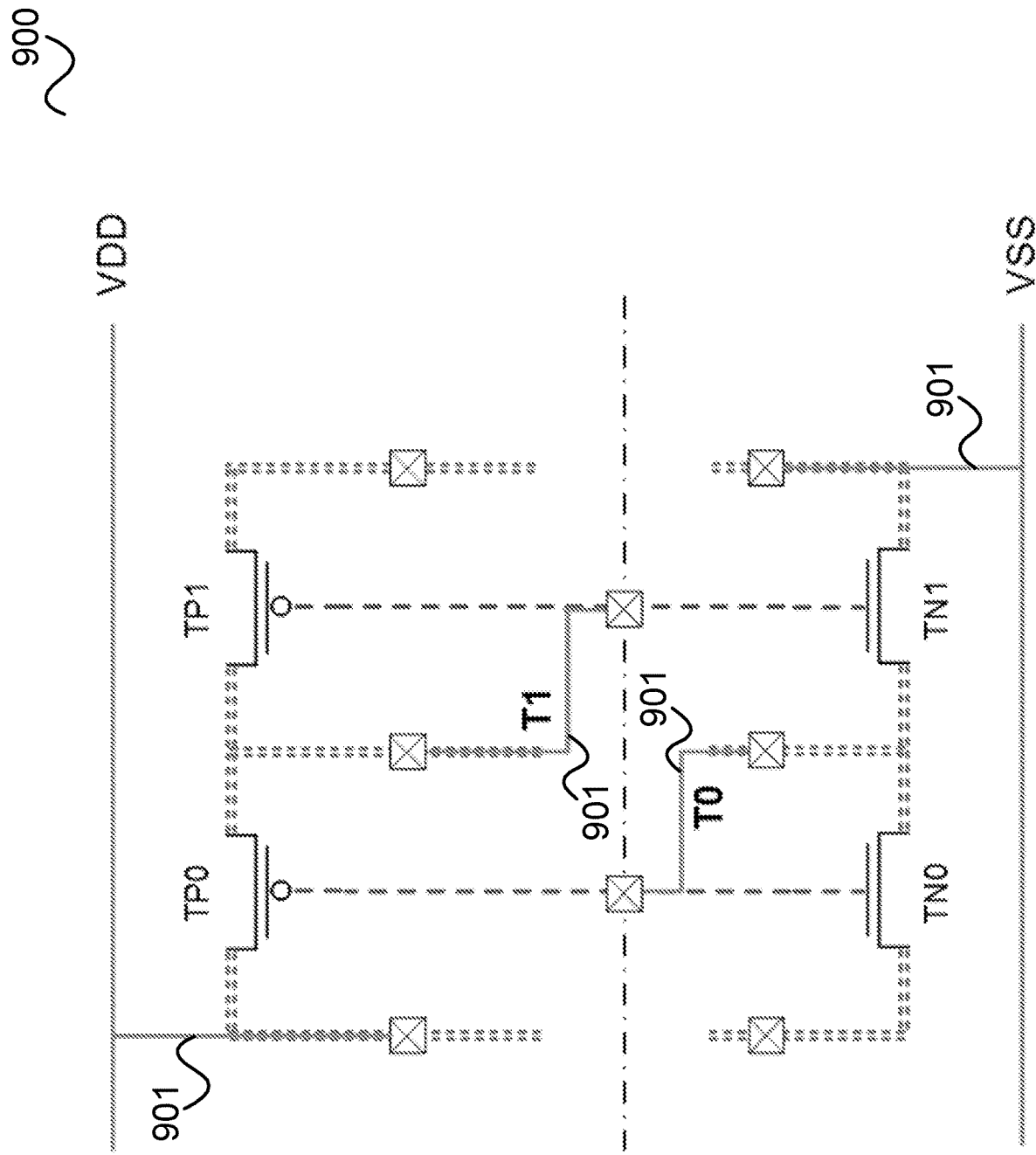
FIG. 9 shows a fourth TIE cell variant formed on the basis of the logic gate base design of FIG. 4.

FIG. 9 shows a fourth TIE cell variant 900 for which the metal layer 204 is structured to form metal lines 901.

Figure 10:
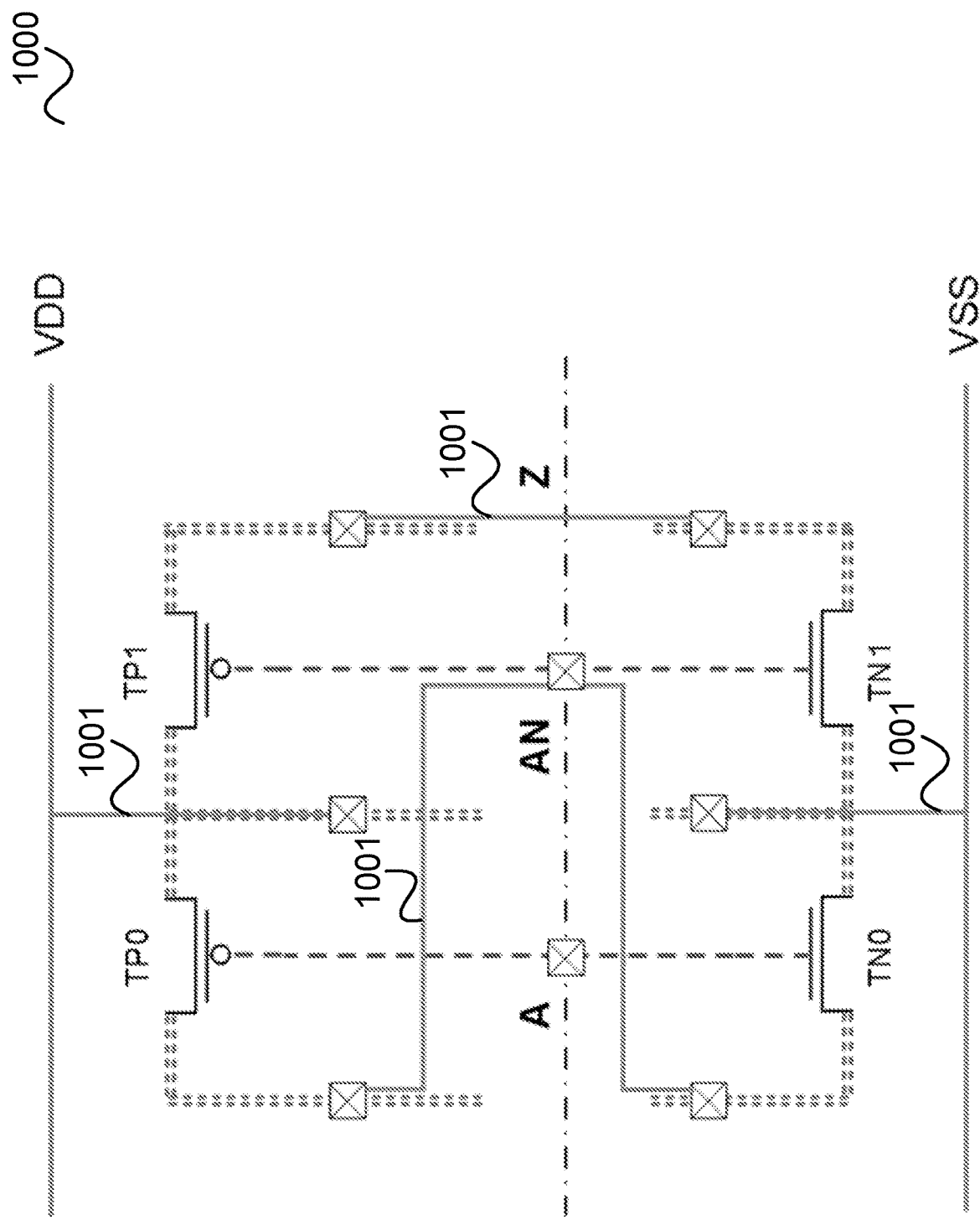
FIG. 10 shows a buffer formed on the basis of the logic gate base design of FIG. 4.

FIG. 10 shows a buffer 1000 for which the metal layer 204 is structured to form metal lines 1001.

The buffer receives an input signal A, inverts it to AN (by means of the inverter consisting of the NMOS and PMOS devices TN0 and TP0, respectively), and outputs an output signal Z (logically) equal to A by means of a second inverter consisting of the NMOS and PMOS devices TN1 and TP1, respectively.

Figure 11:
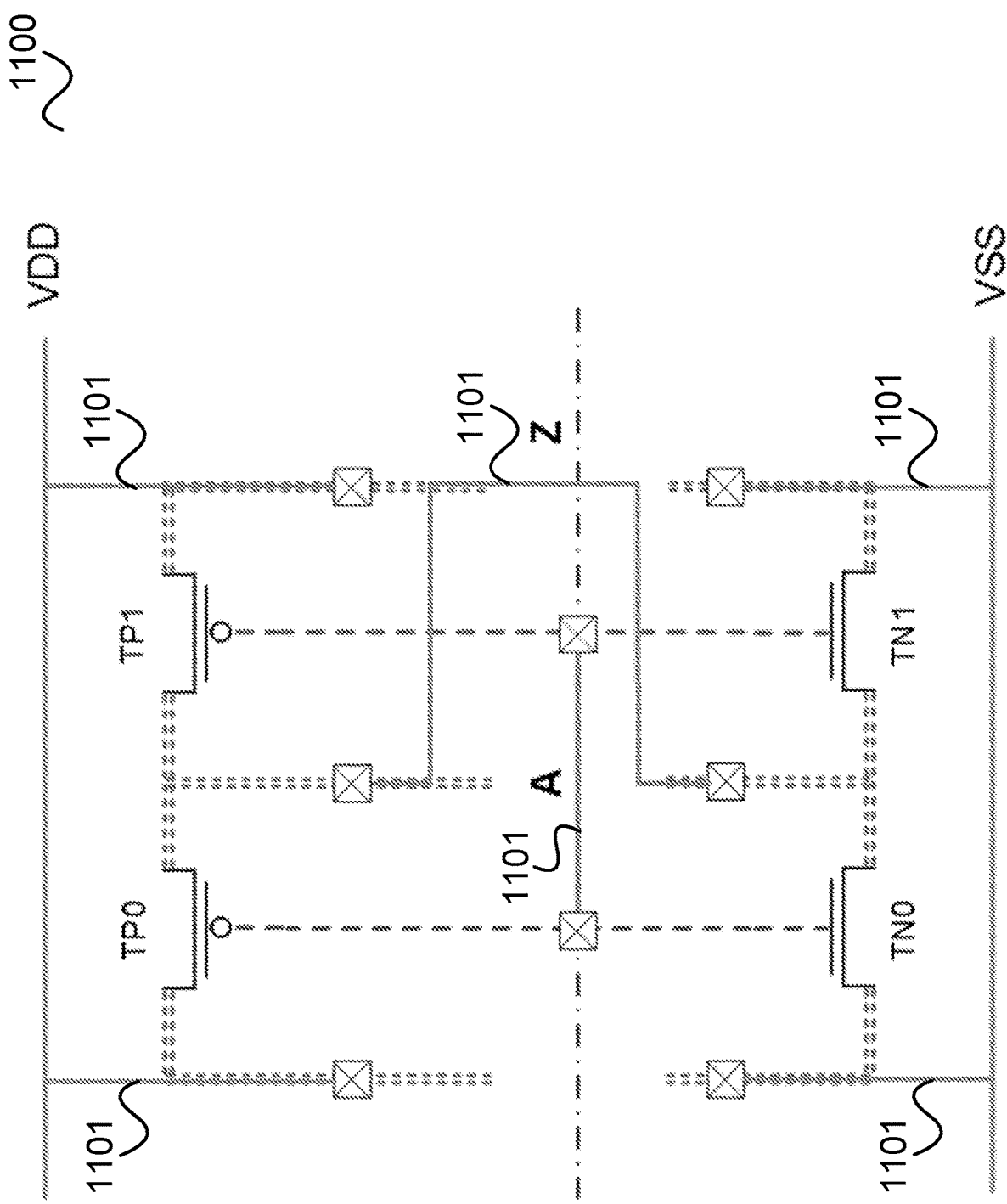
FIG. 11 shows an inverter formed on the basis of the logic gate base design of FIG. 4.

FIG. 11 shows an inverter 1100 for which the metal layer 204 is structured to form metal lines 1101.

The inverter inverts an input signal A to an output signal Z.

All the above examples illustrate the fact that for more complex circuitry, i.e. for more than three poly pitches wide circuitry there are many more possible incarnations of circuits featuring the same or different Boolean functions.

Figure 12:
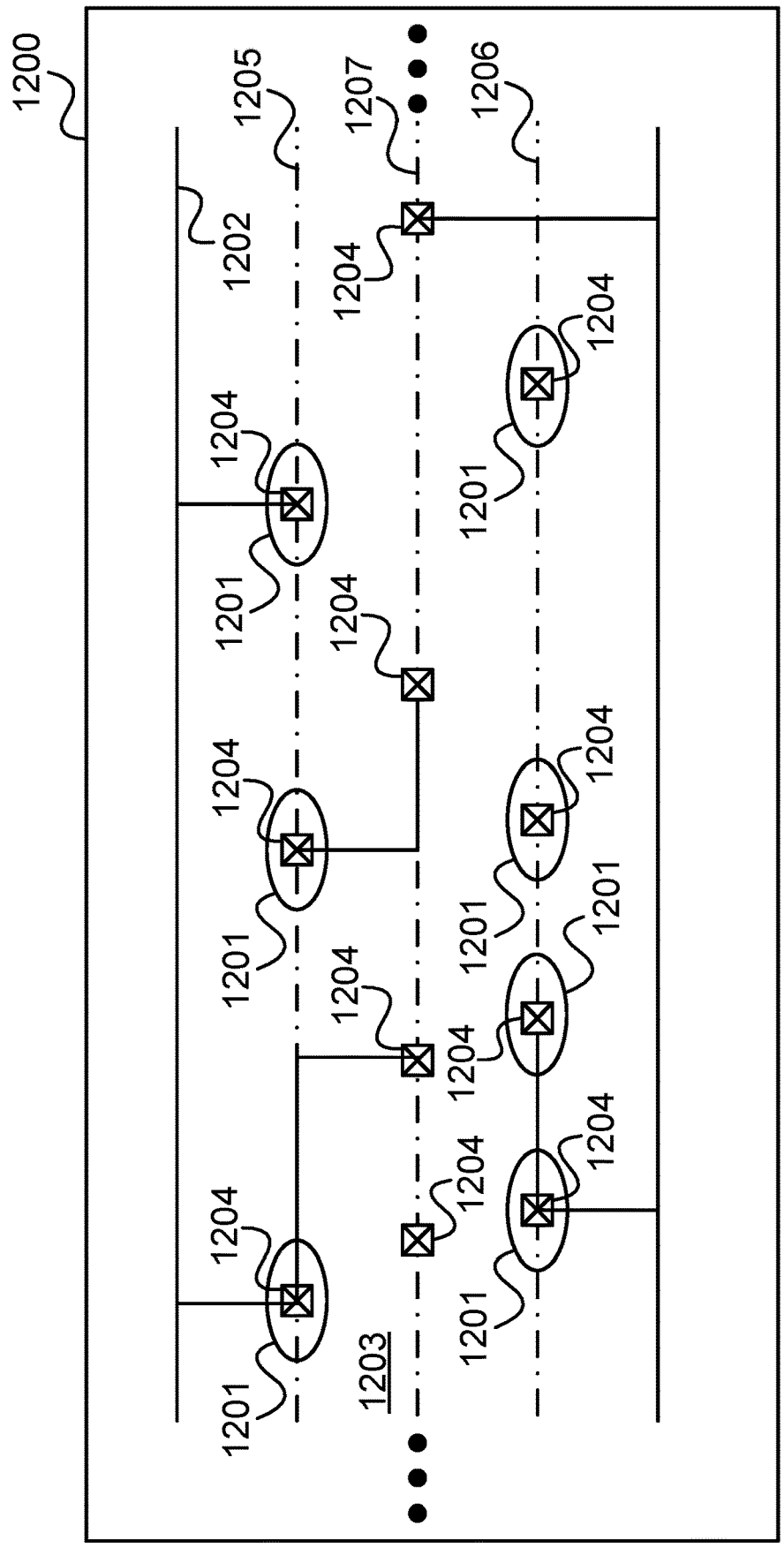
FIG. 12 shows a chip according to an embodiment.

In summary, according to various embodiments, a chip is provided as illustrated in FIG. 12.

FIG. 12 shows a chip 1200 according to an embodiment.

The chip 1200 includes a semiconductor layer including doped regions 1201 and a metallization layer 1202 on the semiconductor layer.

The chip 1200 includes at least one cell row 1203.

The at least one cell row 1203 includes p-channel field effect transistors and n-channel field effect transistors, wherein the doped regions 1201 form source regions and drain regions of the p-channel field effect transistors and the n-channel field effect transistors.

The at least one cell row 1203 further includes contacts 1204 extending from the source regions, the drain regions and gate regions of the p-channel field effect transistors and the n-channel field effect transistors to the metallization layer 1202, wherein the metallization layer is structured in accordance with a metallization grid such that the p-channel field effect transistors and the n-channel field effect transistors are connected to form one or more logic gates.

The contacts connecting the source regions and the drain regions of all p-channel field effect transistors in the at least one cell row to the metallization layer lie along a first line 1205 of the metallization grid, the contacts connecting the source regions and the drain regions of all n-channel field effect transistors in the at least one cell row to the metallization layer lie along a second line 1206 of the metallization grid, and the contacts connecting the gate regions of all p-channel field effect transistors and of the plurality of n-channel field effect transistors in the at least one cell row to the metallization layer lie along a third line 1207 of the metallization grid.

It should be noted that the order of the lines 1205, 1206, 1207 shown in FIG. 12 is only an example and they may also be ordered in a different way. In particular, the third line 1207 does not necessarily lie between the first line 1205 and the second line 1206. Further, it should be noted that the lines 1205, 1206, 1207 are lines of the metallization grid for which not necessarily a metal line needs to be formed (i.e. for which the metallization layer does not necessarily include a metal line). This means that for each line, the metallization layer 1202 may only include metal lines for sections of the lines 1205, 1206, 1207 but not necessarily complete metal lines for the whole lines 1205, 1206, 1207.

According to various embodiments, in other words, the connections (contacts) extending to the metallization layer from the source regions of FETs of the same channel type, the drain regions of FETs of the same channel type and the gate regions of FETs (irrespective of channel type) are each arranged on a respective line of the metallization grid. This means that the contacts of each group (i.e. the groups of source regions of p-channel FETs, source regions of n-channel FETs, drain regions of p-channel FETs, drain regions of n-channel FETs and gate regions) are arranged such that they may be connected by a straight metal line of the metallization grid. This makes the design flexible such that the function of the logic gates can be changed by changing the structure of the metallization layer without the need of rearranging contacts extending from the semiconductor and/or gate layer to the metallization layer.

It should be noted that the position of the contacts may vary a bit, i.e. the contacts of each group may not form a perfect line, due to manufacturing tolerances or limitations. However, contacts positioned along a line of the metallization grid may be understood as being arranged so that these deviations from a perfect line are smaller than the vertical pitch of the metallization grid (or for example smaller than half the vertical pitch of the metallization grid).

According to various embodiments, the metallization layer is the so-called M1 layer, and can be seen as the (lowest) layer provided for connecting source regions, drain regions and gate regions of different field effect transistors.

As mentioned above, the design of the chip 1200 of FIG. 12 allows easily changing the functionality of logic gates. Thus, it allows providing multiple unique chip derivatives within short time intervals, e.g. following a method as illustrated in FIG. 13.

FIG. 13 shows a flow diagram 1300 illustrating a method for manufacturing a chip.

In 1301, a semiconductor layer of the chip is formed.

In 1302, doped regions and gates are formed in and above the semiconductor layer.

In 1303, a metallization layer is formed and structured above the semiconductor layer such that the chip includes at least one cell row including p-channel field effect transistors and n-channel field effect transistors, wherein the doped regions form source regions and drain regions of the p-channel field effect transistors and the n-channel field effect transistors;

contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates according to, for each logic gate, a predetermined (i.e. a given or desired) Boolean function of the logic gate;

wherein the contacts connecting the source regions and the drain regions of all p-channel field effect transistors in the at least one cell row to the metallization layer lie along a first line of the metallization grid, the contacts connecting the source regions and the drain regions of all n-channel field effect transistors in the at least one cell row to the metallization layer lie along a second line of the metallization grid, and the contacts connecting the gate regions of all p-channel field effect transistors and of the plurality of n-channel field effect transistors in the at least one cell row to the metallization layer lie along a third line of the metallization grid.

Various Examples are described in the following:

Example 1 is a chip as described with reference to FIG. 12.

Example 2 is the chip of Example 1, wherein the metallization layer is structured such that the contacts include a first subset of multiple contacts that are connected to each other so that each contact of the first subset is connected to at least one other element of the first subset via the first and/or one or more of the upper metal layers, and include a second subset of multiple contacts that are not connected to any other of the contacts via any of the metal layers.

Example 3 is the chip of Example 1 or 2, including an insulating layer between the semiconductor layer and the metallization layer wherein the contacts extend through the insulating layer.

Example 4 is the chip of any one of Examples 1 to 3, wherein the gate regions are formed above the semiconductor layer and below the first metallization layer.

Example 5 is the chip of any one of Examples 1 to 4, wherein the contacts include contacts for the majority of source regions, drain regions and gate regions of all of the p-channel field effect transistors and all of the n-channel field effect transistors in the at least one cell row.

Example 6 is the chip of any one of Examples 1 to 5, wherein the contacts include contacts for all source regions, drain regions and gate regions of at least some of the p-channel field effect transistors and at least some of the n-channel field effect transistors in the at least one cell row.

Example 7 is the chip of any one of Examples 1 to 6, wherein the contacts include contacts for all source regions, drain regions and gate regions of the majority of the p-channel field effect transistors and of the majority of the n-channel field effect transistors in the at least one cell row.

Example 8 is the chip of any one of Examples 1 to 7, wherein the contacts include contacts for all source regions, drain regions and gate regions of all p-channel field effect transistors and all n-channel field effect transistors in the at least one cell row.

Example 9 is the chip of any one of Examples 1 to 8, wherein the metallization layer includes supply lines defining the cell rows.

Example 10 is the chip of Example 9, wherein the first line, the second line and the third line are parallel to the supply lines.

Example 11 is the chip of any one of Examples 1 to 10, wherein the metallization grid includes a metal track in between each pair of two lines of the first line, the second line and the third line and/or in between each pair of one of the first line, the second line and the third line and a supply line.

Example 12 is the chip of any one of Examples 1 to 11, wherein the chip includes a plurality of cell rows, each cell row including p-channel field effect transistors and n-channel field effect transistors, wherein the doped regions form source regions and drain regions of the p-channel field effect transistors and the n-channel field effect transistors;

contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates;

wherein the contacts connecting the source regions and the drain regions of all p-channel field effect transistors in the at least one cell row to the metallization layer lie along a first line of the metallization grid, the contacts connecting the source regions and the drain regions of all n-channel field effect transistors in the at least one cell row to the metallization layer lie along a second line of the metallization grid, and the contacts connecting the gate regions of all p-channel field effect transistors and of the plurality of n-channel field effect transistors in the at least one cell row to the metallization layer lie along a third line of the metallization grid.

Example 13 is a method for manufacturing a chip as illustrated in FIG. 13.

Example 14 is the method of Example 13, wherein the metallization layer is structured such that the contacts include a first subset of multiple contacts that are connected to each other so that each contact of the first subset is connected to at least one other element of the first subset via the first and/or one or more of the upper metal layers, and include a second subset of multiple contacts that are not connected to any other of the contacts via any of the metal layers.

Example 15 is the method of Example 13 or 14, including forming an insulating layer between the semiconductor layer and the metallization layer such that the contacts extend through the insulating layer.

Example 16 is the method of any one of Examples 13 to 15, wherein the gate regions are formed above the semiconductor layer and below the first metallization layer.

Example 17 is the method of any one of Examples 13 to 16, wherein the contacts are formed to include contacts for the majority of source regions, drain regions and gate regions of all of the p-channel field effect transistors and all of the n-channel field effect transistors in the at least one cell row.

Example 18 is the method of any one of Examples 13 to 17, wherein the contacts are formed to include contacts for all source regions, drain regions and gate regions of at least some of the p-channel field effect transistors and at least some of the n-channel field effect transistors in the at least one cell row.

Example 19 is the method of any one of Examples 13 to 18, wherein the contacts are formed to include contacts for all source regions, drain regions and gate regions of the majority of the p-channel field effect transistors and of the majority of the n-channel field effect transistors in the at least one cell row.

Example 20 is the method of any one of Examples 13 to 19, wherein the contacts are formed to include contacts for all source regions, drain regions and gate regions of all p-channel field effect transistors and all n-channel field effect transistors in the at least one cell row.

Example 21 is the method of any one of Examples 13 to 20, wherein the metallization layer is formed to include supply lines defining the cell rows.

Example 22 is the method of Example 21, wherein the first line, the second line and the third line are parallel to the supply lines.

Example 23 is the method of any one of Examples 21 to 22, wherein the metallization grid includes a metal track in between each pair of two lines of the first line, the second line and the third line and/or in between each pair of one of the first line, the second line and the third line and a supply line.

Example 24 is the method of any one of Examples 21 to 23, including forming and structuring the metallization layer on the semiconductor layer such that the chip includes a plurality of cell rows, each cell row including
    p-channel field effect transistors and n-channel field effect transistors, wherein the doped regions form source regions and drain regions of the p-channel field effect transistors and the n-channel field effect transistors;
    contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates according to, for each logic gate, a predetermined Boolean function of the logic gate;
wherein
    the contacts connecting the source regions and the drain regions of all p-channel field effect transistors in the at least one cell row to the metallization layer lie along a first line of the metallization grid,
    the contacts connecting the source regions and the drain regions of all n-channel field effect transistors in the at least one cell row to the metallization layer lie along a second line of the metallization grid, and
    the contacts connecting the gate regions of all p-channel field effect transistors and of the plurality of n-channel field effect transistors in the at least one cell row to the metallization layer lie along a third line of the metallization grid.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE SIGNS 100 integrated circuit
101, 102 supply lines
103 cell rows
104 logic gates
200 integrated circuit
201 semiconductor layer
202 doped regions
203 insulating layer
204 metallization layer 204
205 contacts
206 gate electrodes
301 NAND gate
302 contacts
303 p-channel FETs
304 contacts
305 n-channel FETs
306 contacts
307-309 horizontal lines
310, 311 supply lines
312, 313 metal lines
400 logic gate base design
401 contacts
402 p-channel FETs
403 contacts
404 n-channel FETs
405 contacts
406-408 horizontal lines
500 NOR gate
501 metal lines
600 TIE cell
601 metal lines
700 TIE cell
701 metal lines 800 TIE cell
801 metal lines
900 TIE cell
901 metal lines
1000 buffer
1001 metal lines
1100 inverter
1101 metal lines
1200 chip
1201 doped regions
1202 metallization layer
1203 cell row
1204 contacts
1205-1207 lines
1300 flow diagram
1301, 1302 processing

What is claimed is:

1. A chip comprising:
a semiconductor layer comprising doped regions;
a metallization layer on the semiconductor layer; and
at least one cell row comprising
p-channel field effect transistors and n-channel field effect transistors, wherein the doped regions form source regions and drain regions of the p-channel field effect transistors and the n-channel field effect transistors;
contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates;
wherein
the contacts connecting the source regions and the drain regions of all p-channel field effect transistors in the at least one cell row to the metallization layer lie along a first line of the metallization grid,
the contacts connecting the source regions and the drain regions of all n-channel field effect transistors in the at least one cell row to the metallization layer lie along a second line of the metallization grid, and
the contacts connecting the gate regions of all p-channel field effect transistors and of the plurality of n-channel field effect transistors in the at least one cell row to the metallization layer lie along a third line of the metallization grid.

2. The chip of claim 1, wherein the metallization layer is structured such that the contacts comprise a first subset of multiple contacts that are connected to each other so that each contact of the first subset is connected to at least one other element of the first subset via the first and/or one or more of the upper metal layers, and comprise a second subset of multiple contacts that are not connected to any other of the contacts via any of the metal layers.

3. The chip of claim 1, comprising an insulating layer between the semiconductor layer and the metallization layer wherein the contacts extend through the insulating layer.

4. The chip of claim 1, wherein the gate regions are formed above the semiconductor layer and below the first metallization layer.

5. The chip of claim 1, wherein the contacts comprise contacts for the majority of source regions, drain regions and gate regions of all of the p-channel field effect transistors and all of the n-channel field effect transistors in the at least one cell row.

6. The chip of claim 1, wherein the contacts comprise contacts for all source regions, drain regions and gate regions of at least some of the p-channel field effect transistors and at least some of the n-channel field effect transistors in the at least one cell row.

7. The chip of claim 1, wherein the contacts comprise contacts for all source regions, drain regions and gate regions of the majority of the p-channel field effect transistors and of the majority of the n-channel field effect transistors in the at least one cell row.

8. The chip of claim 1, wherein the contacts comprise contacts for all source regions, drain regions and gate regions of all p-channel field effect transistors and all n-channel field effect transistors in the at least one cell row.

9. The chip of claim 1, wherein the metallization layer comprises supply lines defining the cell rows.

10. The chip of claim 9, wherein the first line, the second line and the third line are parallel to the supply lines.

11. The chip of claim 1, wherein the metallization grid comprises a metal track in between each pair of two lines of the first line, the second line and the third line and/or in between each pair of one of the first line, the second line and the third line and a supply line.

12. The chip of claim 1, wherein the chip comprises a plurality of cell rows, each cell row comprising
p-channel field effect transistors and n-channel field effect transistors, wherein the doped regions form source regions and drain regions of the p-channel field effect transistors and the n-channel field effect transistors;
contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates;
wherein
the contacts connecting the source regions and the drain regions of all p-channel field effect transistors in the at least one cell row to the metallization layer lie along a first line of the metallization grid,
the contacts connecting the source regions and the drain regions of all n-channel field effect transistors in the at least one cell row to the metallization layer lie along a second line of the metallization grid, and
the contacts connecting the gate regions of all p-channel field effect transistors and of the plurality of n-channel field effect transistors in the at least one cell row to the metallization layer lie along a third line of the metallization grid.

13. A method for manufacturing a chip comprising:
forming a semiconductor layer of the chip;
forming doped regions in and gates above the semiconductor layer;
forming and structuring a metallization layer on the semiconductor layer such that the chip comprises at least one cell row comprising:
p-channel field effect transistors and n-channel field effect transistors, wherein the doped regions form source regions and drain regions of the p-channel field effect transistors and the n-channel field effect transistors;
contacts extending from the source regions, the drain regions and gate regions of the p-channel field effect transistors and the n-channel field effect transistors to the metallization layer, wherein the metallization layer is structured in accordance with a metallization grid such that the p-channel field effect transistors and the n-channel field effect transistors are connected to form one or more logic gates according to, for each logic gate, a predetermined Boolean function of the logic gate;

wherein
    the contacts connecting the source regions and the drain regions of all p-channel field effect transistors in the at least one cell row to the metallization layer lie along a first line of the metallization grid,
    the contacts connecting the source regions and the drain regions of all n-channel field effect transistors in the at least one cell row to the metallization layer lie along a second line of the metallization grid, and
    the contacts connecting the gate regions of all p-channel field effect transistors and of the plurality of n-channel field effect transistors in the at least one cell row to the metallization layer lie along a third line of the metallization grid.

\* \* \* \* \*